United States Patent
Bouche et al.

(10) Patent No.: US 9,502,528 B2
(45) Date of Patent: Nov. 22, 2016

(54) BORDERLESS CONTACT FORMATION THROUGH METAL-RECESS DUAL CAP INTEGRATION

(71) Applicant: GLOBALFOUNDRIES Inc., Grand Cayman (KY)

(72) Inventors: Guillaume Bouche, Albany, NY (US); Jason E. Stephens, Albany, NY (US); Tuhin Guha Neogi, Clifton Park, NY (US); Mark A. Zaleski, Galway, NY (US); Andy Chih-Hung Wei, Queensbury, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/469,014

(22) Filed: Aug. 26, 2014

(65) Prior Publication Data

US 2016/0064514 A1 Mar. 3, 2016

(51) Int. Cl.
| | | |
|---|---|---|
| *H01L 29/66* | (2006.01) | |
| *H01L 29/417* | (2006.01) | |
| *H01L 29/165* | (2006.01) | |
| *H01L 21/8238* | (2006.01) | |
| *H01L 27/092* | (2006.01) | |

(52) U.S. Cl.
CPC ... *H01L 29/66545* (2013.01); *H01L 29/41783* (2013.01); *H01L 29/6653* (2013.01); *H01L 21/823871* (2013.01); *H01L 27/092* (2013.01); *H01L 29/165* (2013.01)

(58) Field of Classification Search
CPC . H01L 21/768; H01L 21/027; H01L 21/033; H01L 21/31144; H01L 21/32139; H01L 21/76877; H01L 21/0334; H01L 21/0338
See application file for complete search history.

(56) References Cited

U.S. PATENT DOCUMENTS

| 8,796,783 B2 | 8/2014 | Fan et al. |
|---|---|---|
| 2012/0217588 A1 | 8/2012 | Vega |
| 2013/0178035 A1 | 7/2013 | Vega |
| 2014/0073104 A1* | 3/2014 | Chen ................. H01L 21/31144 438/299 |

* cited by examiner

*Primary Examiner* — Mohammad Islam
*Assistant Examiner* — Mikka Liu
(74) *Attorney, Agent, or Firm* — Williams Morgan, P.C.

(57) ABSTRACT

An improved semiconductor structure and methods of fabrication that provide improved transistor contacts in a semiconductor structure are provided. A first block mask is formed over a portion of the semiconductor structure. This first block mask covers at least a portion of at least one source/drain (s/d) contact location. An s/d capping layer is formed over the s/d contact locations that are not covered by the first block mask. This s/d capping layer is comprised of a first capping substance. Then, a second block mask is formed over the semiconductor structure. This second block mask exposes at least one gate location. A gate capping layer, which comprises a second capping substance, is removed from the exposed gate location(s). Then a metal contact layer is deposited, which forms a contact to both the s/d contact location(s) and the gate contact location(s).

13 Claims, 14 Drawing Sheets

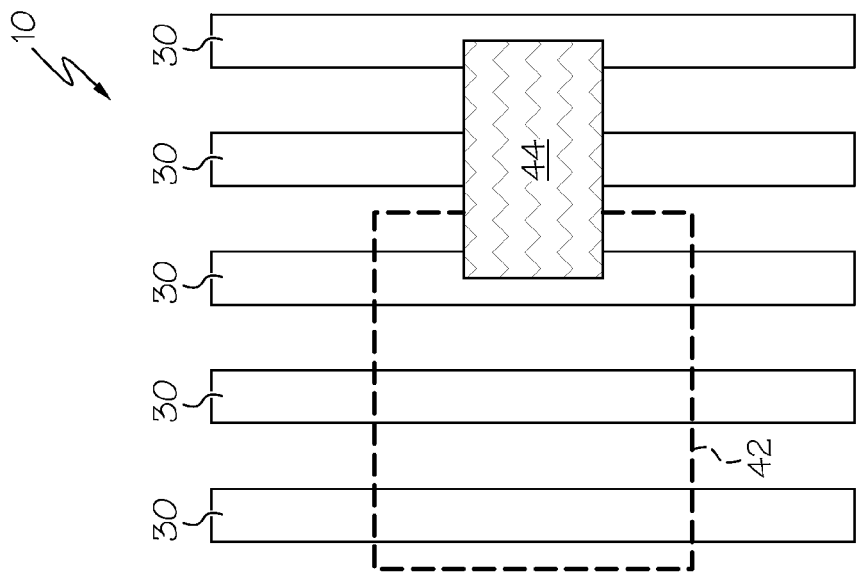
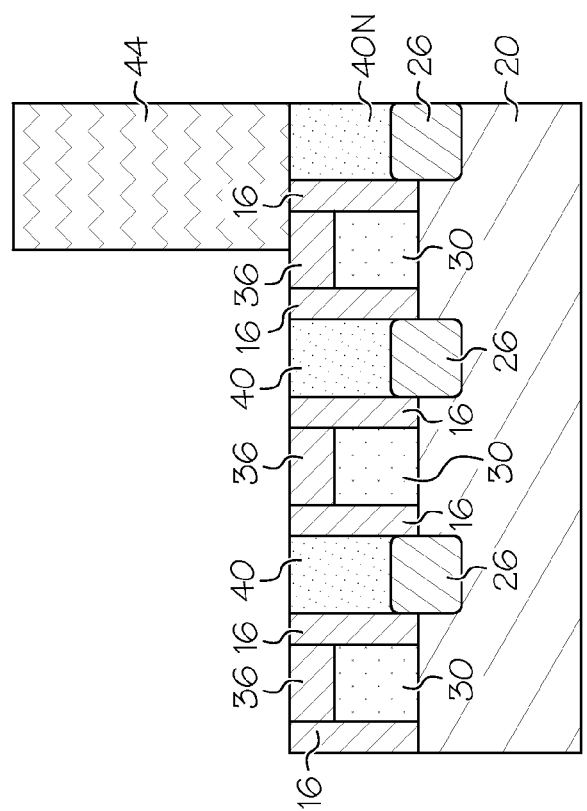
FIG. 5B
FIG. 5A

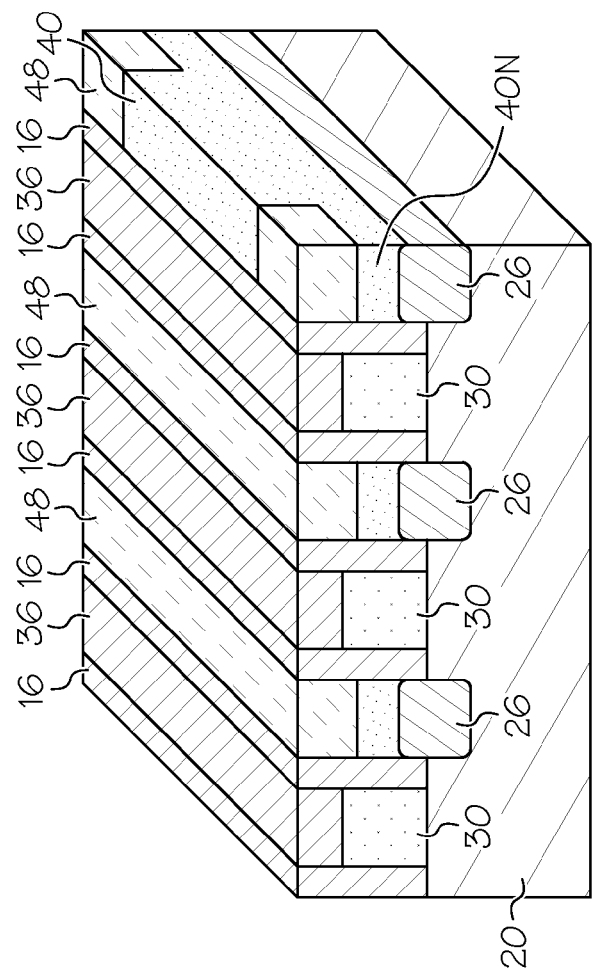
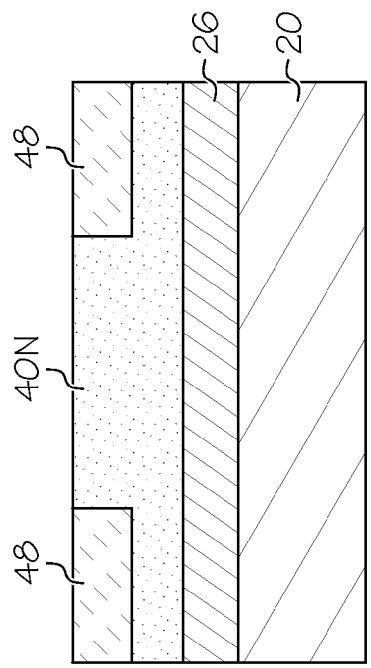
FIG. 6B
FIG. 6C

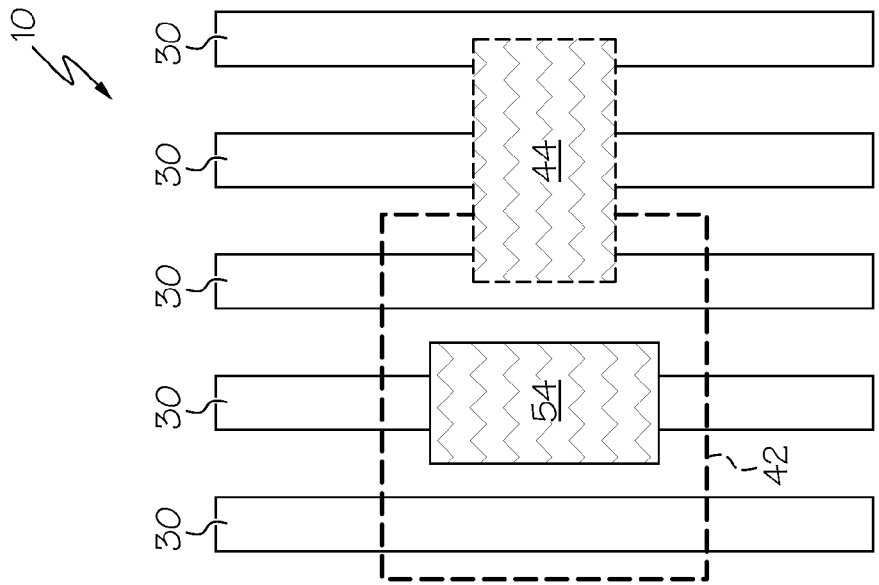
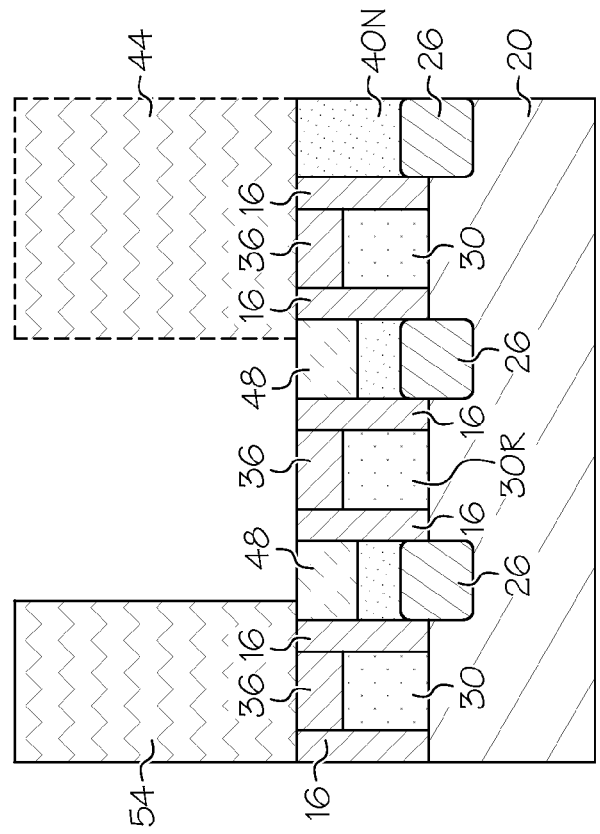
FIG. 7B
FIG. 7A

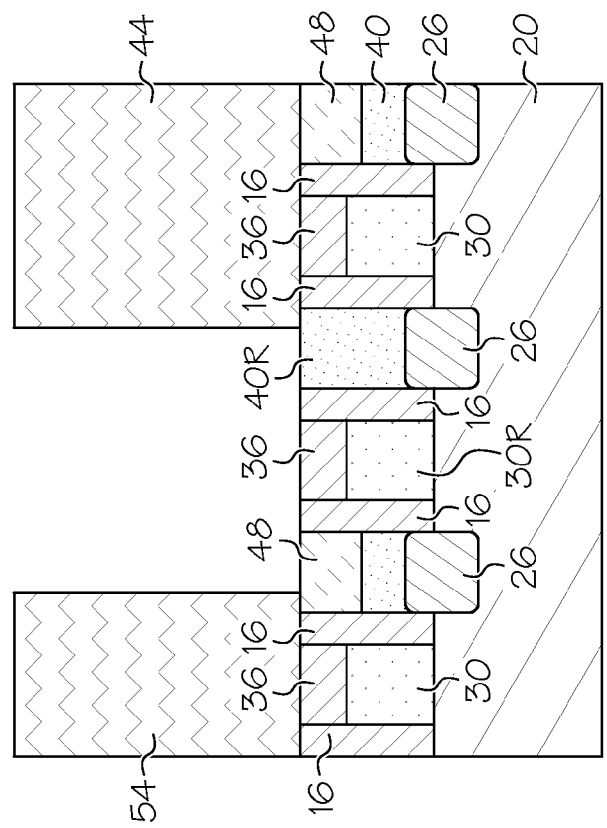
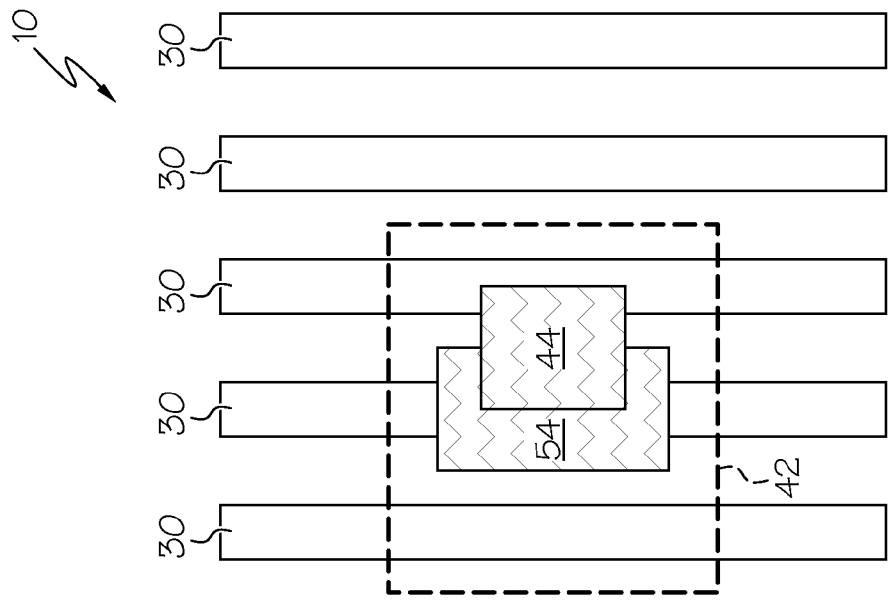
FIG. 11A
FIG. 11B

BORDERLESS CONTACT FORMATION THROUGH METAL-RECESS DUAL CAP INTEGRATION

FIELD OF THE INVENTION

The present invention relates generally to semiconductor fabrication, and more particularly, to structures for transistor contacts and methods of fabrication.

BACKGROUND

As technology progresses, the manufacture of electronic devices must be improved to meet the trend of mobile, lightweight, and efficient electronic devices. In addition to reducing the size of the semiconductor devices, miniaturization can also be achieved by reducing the distance between semiconductor devices. However, process problems remain that limit the amount of miniaturization that can be achieved. In particular, the contacts which interface the devices to metallization layers can pose numerous challenges. It is therefore desirable to have improved contacts and methods of fabrication.

SUMMARY

Embodiments of the present invention provide an improved semiconductor structure and methods of fabrication that provide improved transistor contacts in a semiconductor structure. A first block mask is formed over a portion of the semiconductor structure. This first block mask covers at least a portion of at least one source/drain (s/d) contact location. An s/d capping layer is formed over the s/d contact locations that are not covered by the first block mask. This s/d capping layer is comprised of a first capping substance. Then, a second block mask is formed over the semiconductor structure. This second block mask exposes at least one gate location. A previously formed gate capping layer, which comprises a second capping substance, is removed from the exposed gate location(s). Then a metal contact layer is deposited. This metal contact layer forms a contact to both the s/d contact location(s) previously covered by the first block mask and to the gate contact location(s) exposed by the second block mask.

In a first aspect, embodiments of the present invention provide a method of forming a set of contacts in a semiconductor structure comprising: forming a first block mask over a portion of the semiconductor structure, wherein the first block mask covers at least a portion of at least one source/drain (s/d) contact location; forming a s/d capping layer over a set of s/d contact locations that are not covered by the first block mask, the s/d capping layer comprising a first capping substance; forming a second block mask over the semiconductor structure, wherein the second block mask exposes at least one gate location; removing a gate capping layer from the at least one gate location, the gate capping layer comprising a second capping substance; and depositing a metal contact layer that forms a contact to the at least one s/d contact location and to the at least one gate contact location.

In a second aspect, embodiments of the present invention provide a method of forming a semiconductor structure comprising: covering a plurality of transistor gates with a first capping layer; covering a plurality of source/drain contact areas with a second capping layer; forming a first mask over the semiconductor structure, wherein the first mask exposes a plurality of gate contact locations; removing the first capping layer from the plurality of gate contact locations; forming a second mask over the semiconductor structure, wherein the second mask exposes a plurality of source/drain contact locations; removing the second capping layer from the plurality of source/drain contact locations; and depositing a metallization line over the exposed source/drain contact locations and exposed gate contact locations, wherein the first capping layer comprises silicon oxide and the second capping layer comprises silicon nitride.

In a third aspect, embodiments of the present invention provide a semiconductor structure comprising: a plurality of transistor gates; a plurality of transistor source/drain contact areas; a first capping layer disposed on a subset of the plurality of transistor gates; a second capping layer disposed on a subset of the plurality of transistor source/drain contact areas; and a metallization layer disposed on the first capping layer and second capping layer.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
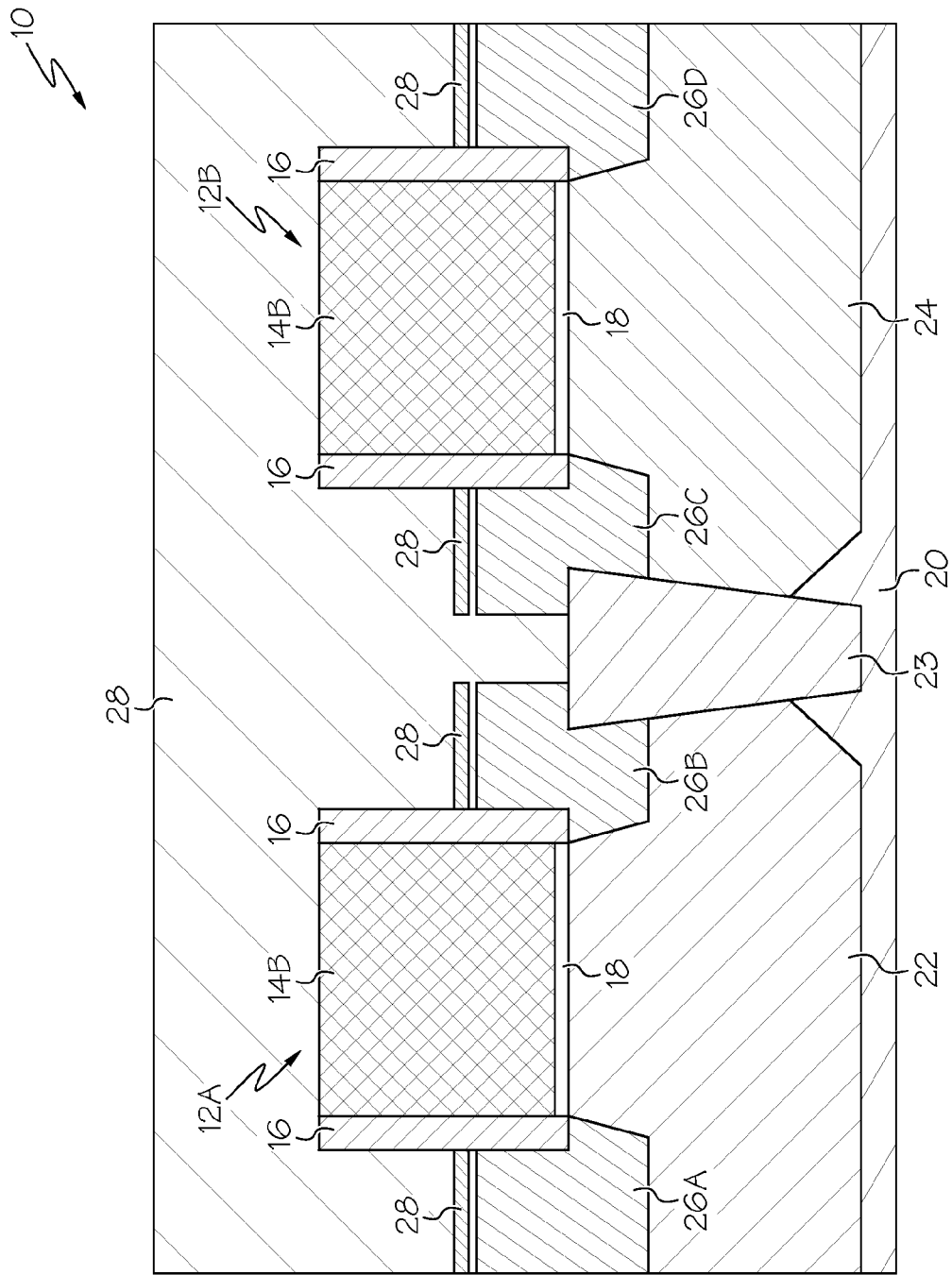
Figure 2:
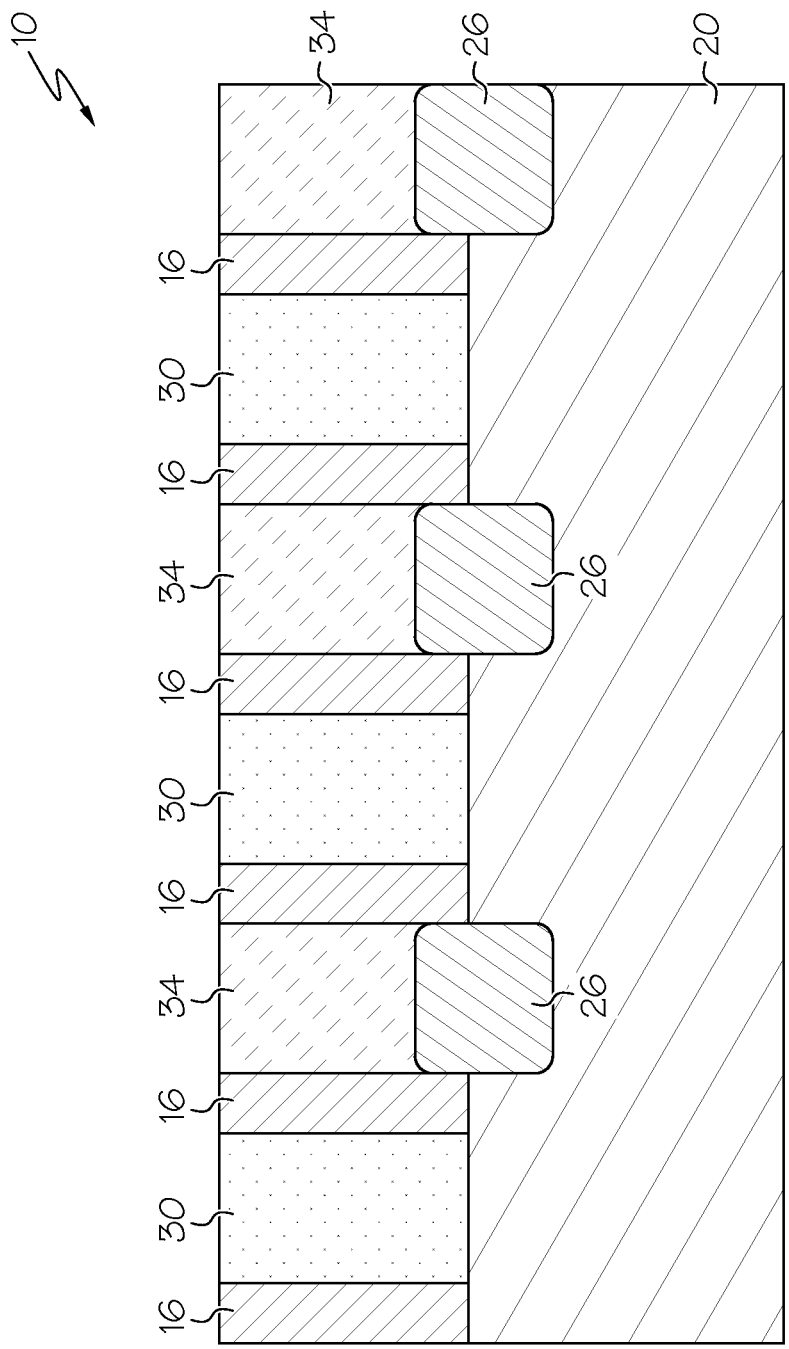
Figure 3:
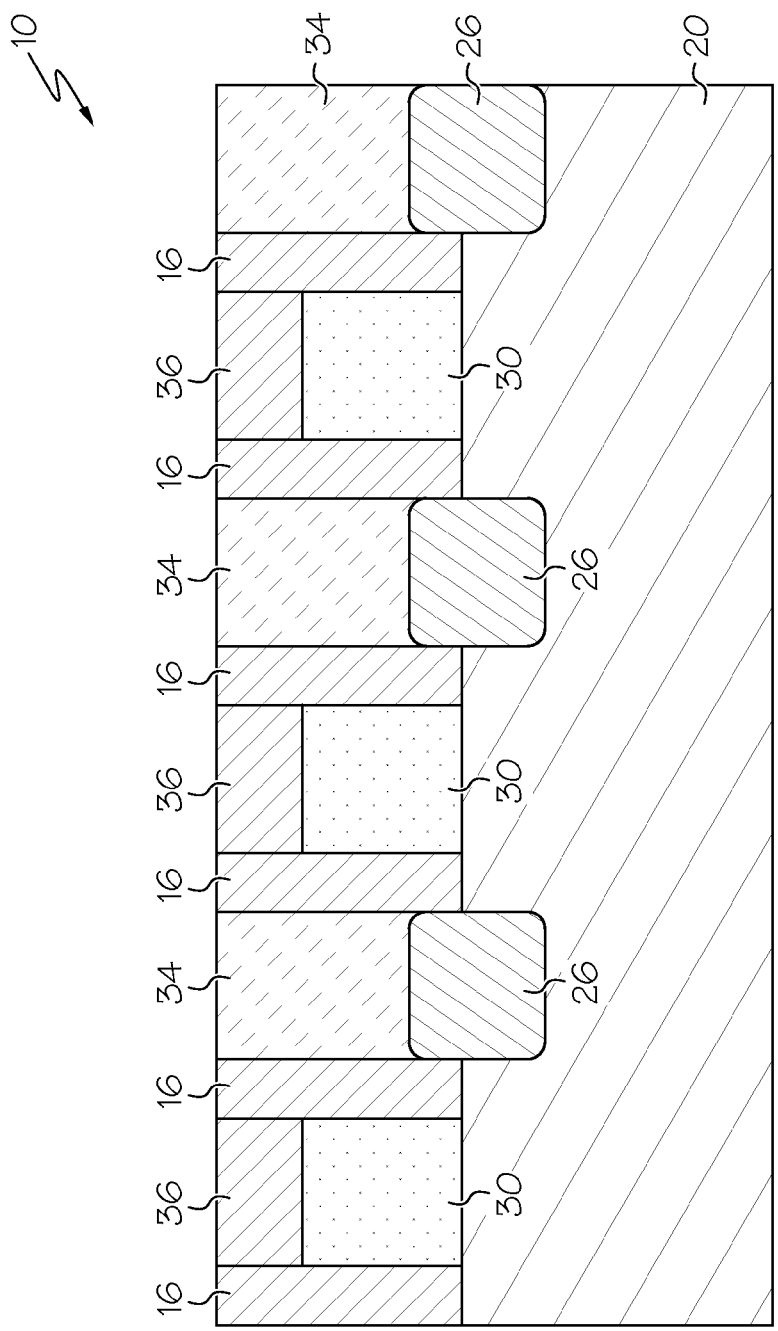
Figure 4:
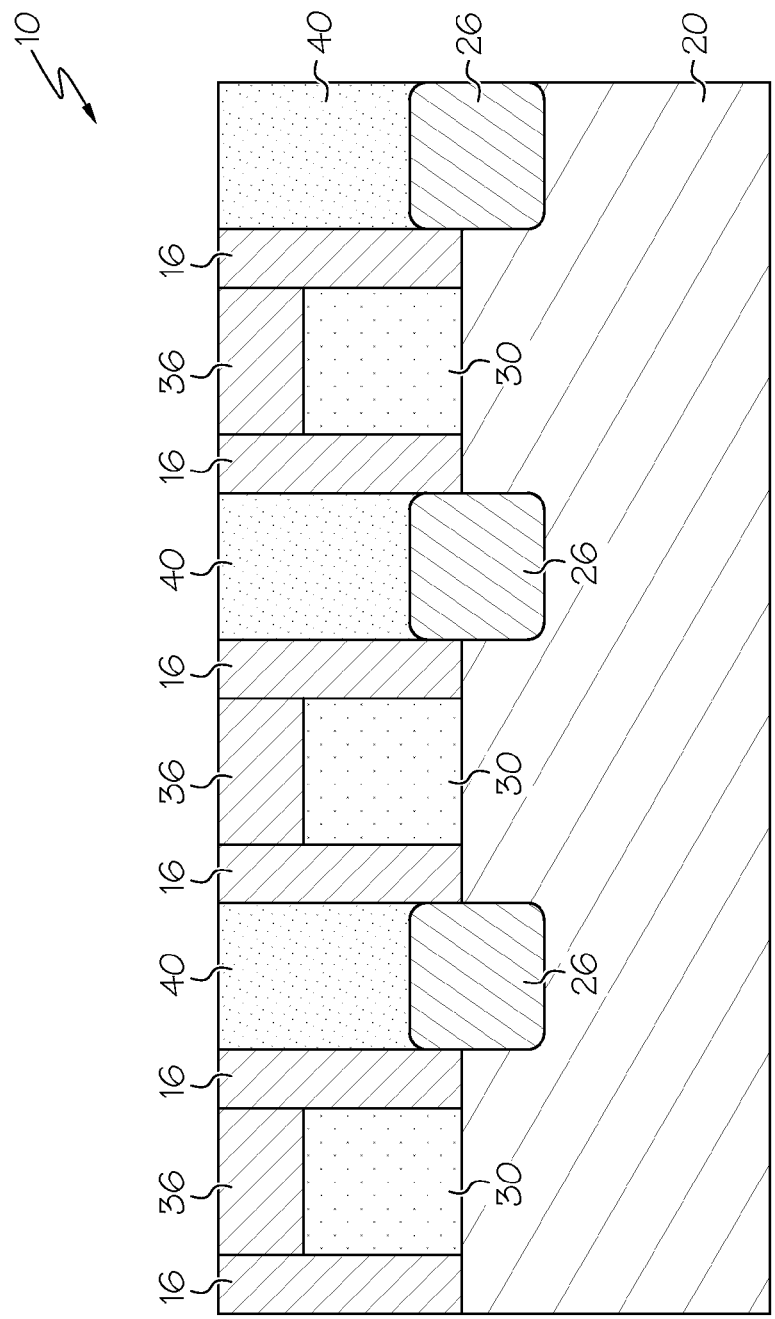
Figure 6A:
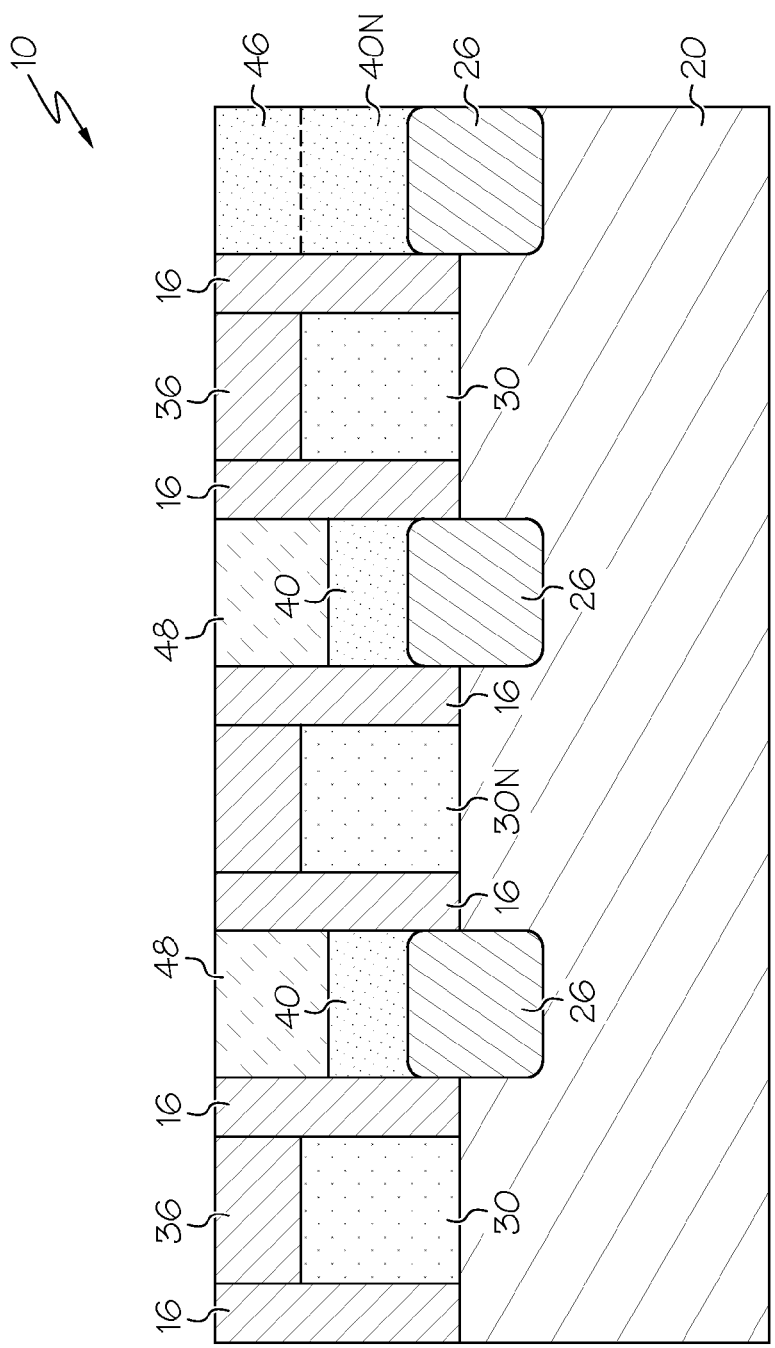
Figure 8:
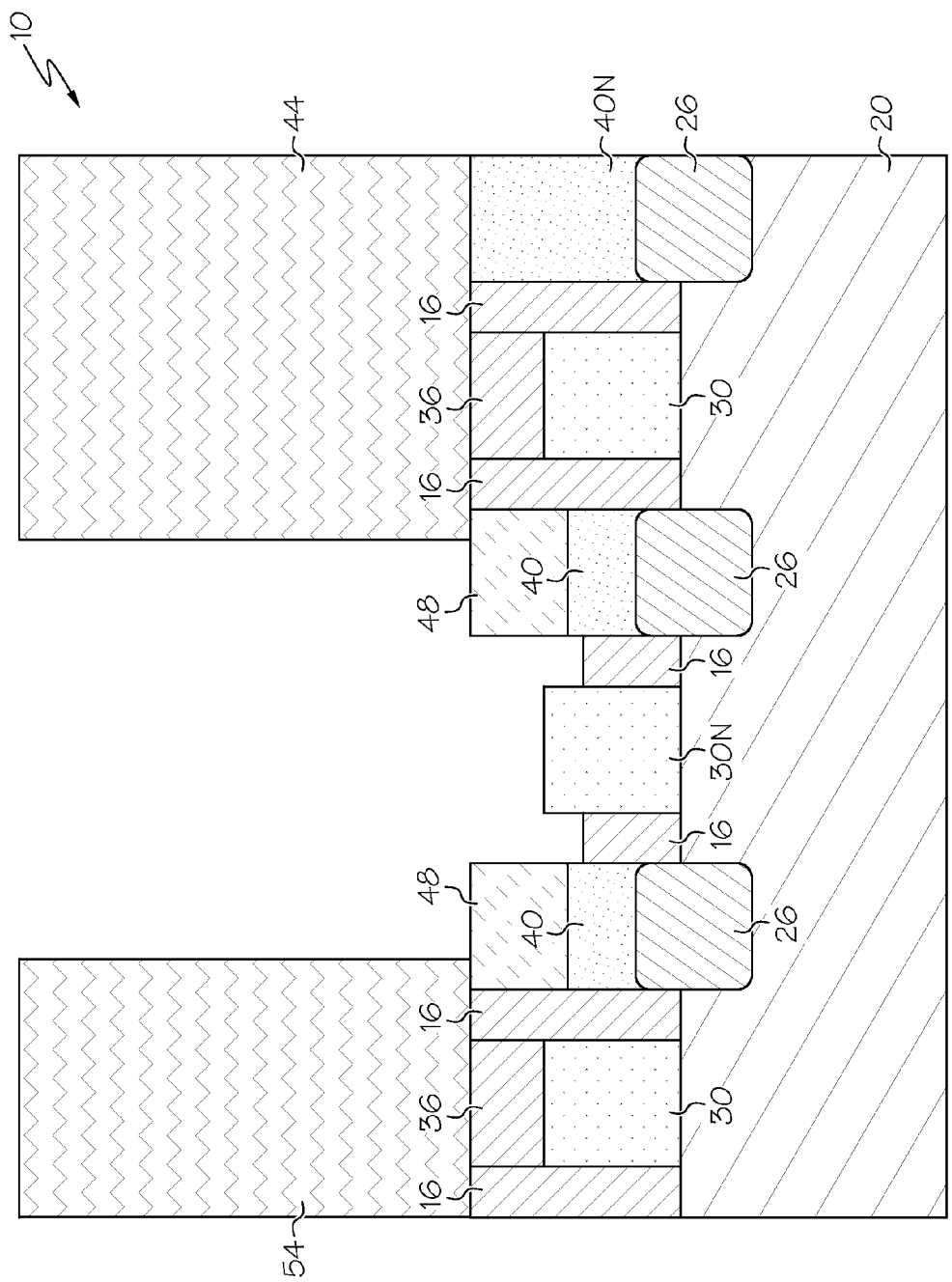
Figure 9:
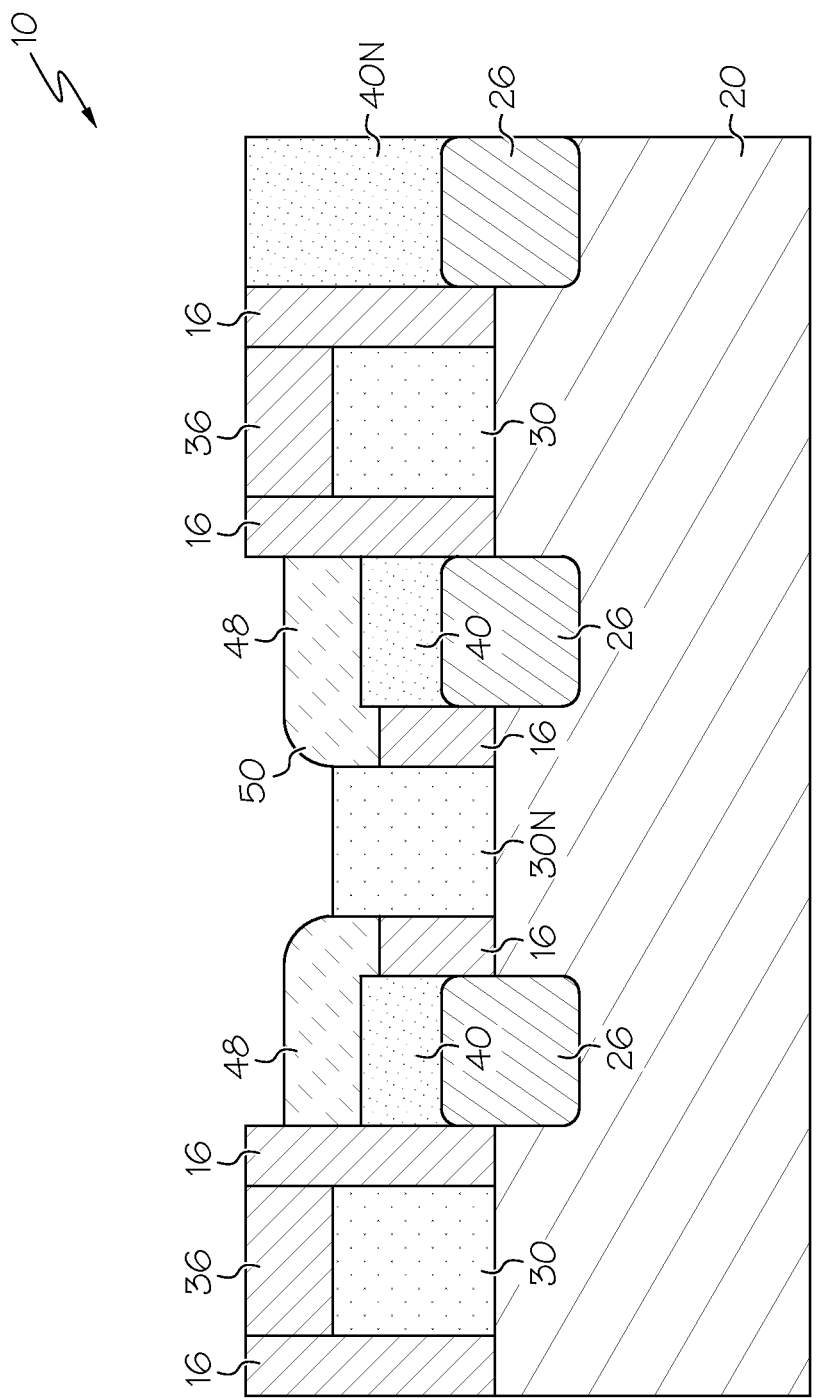
Figure 10:
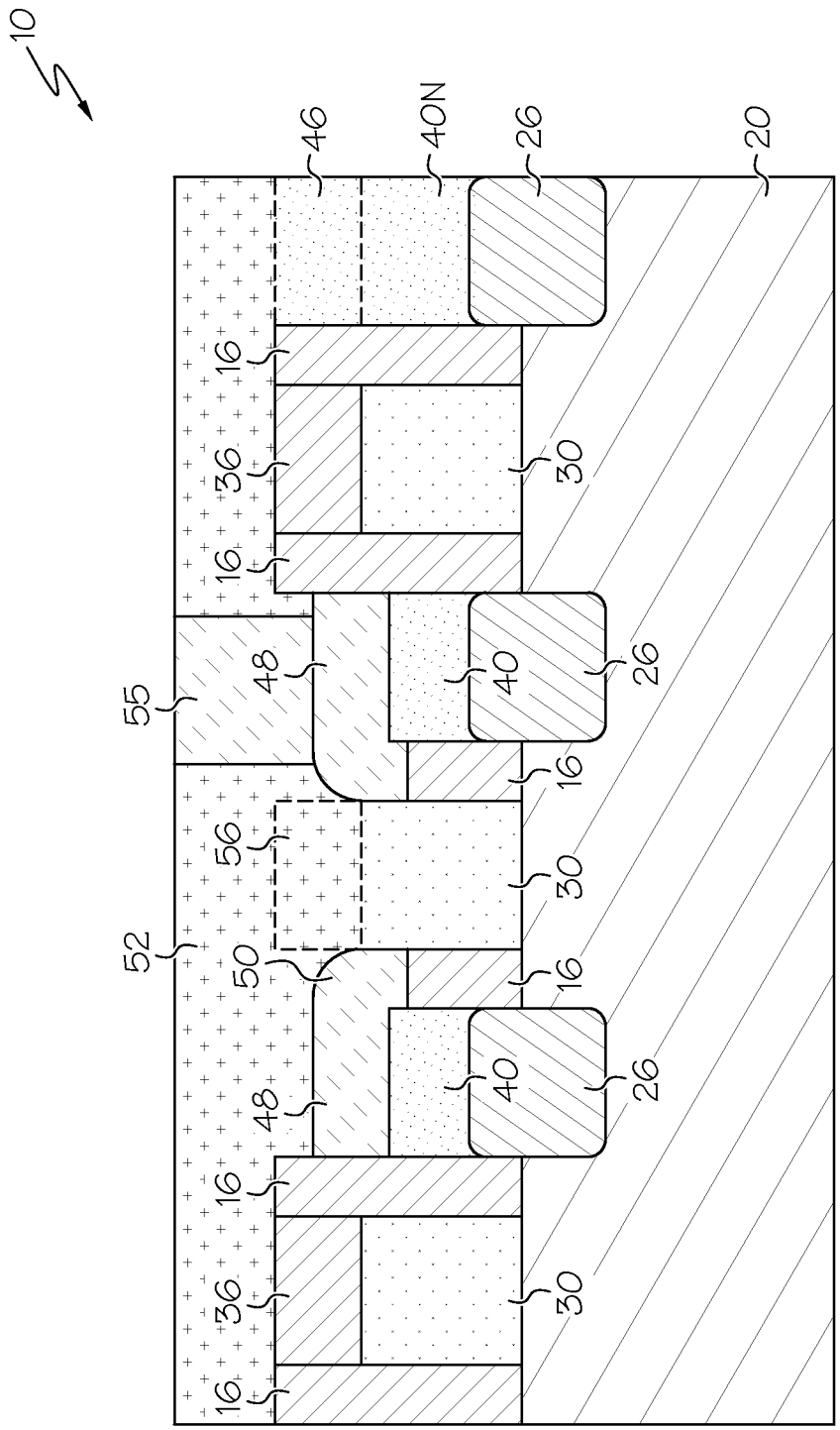
Figure 12:
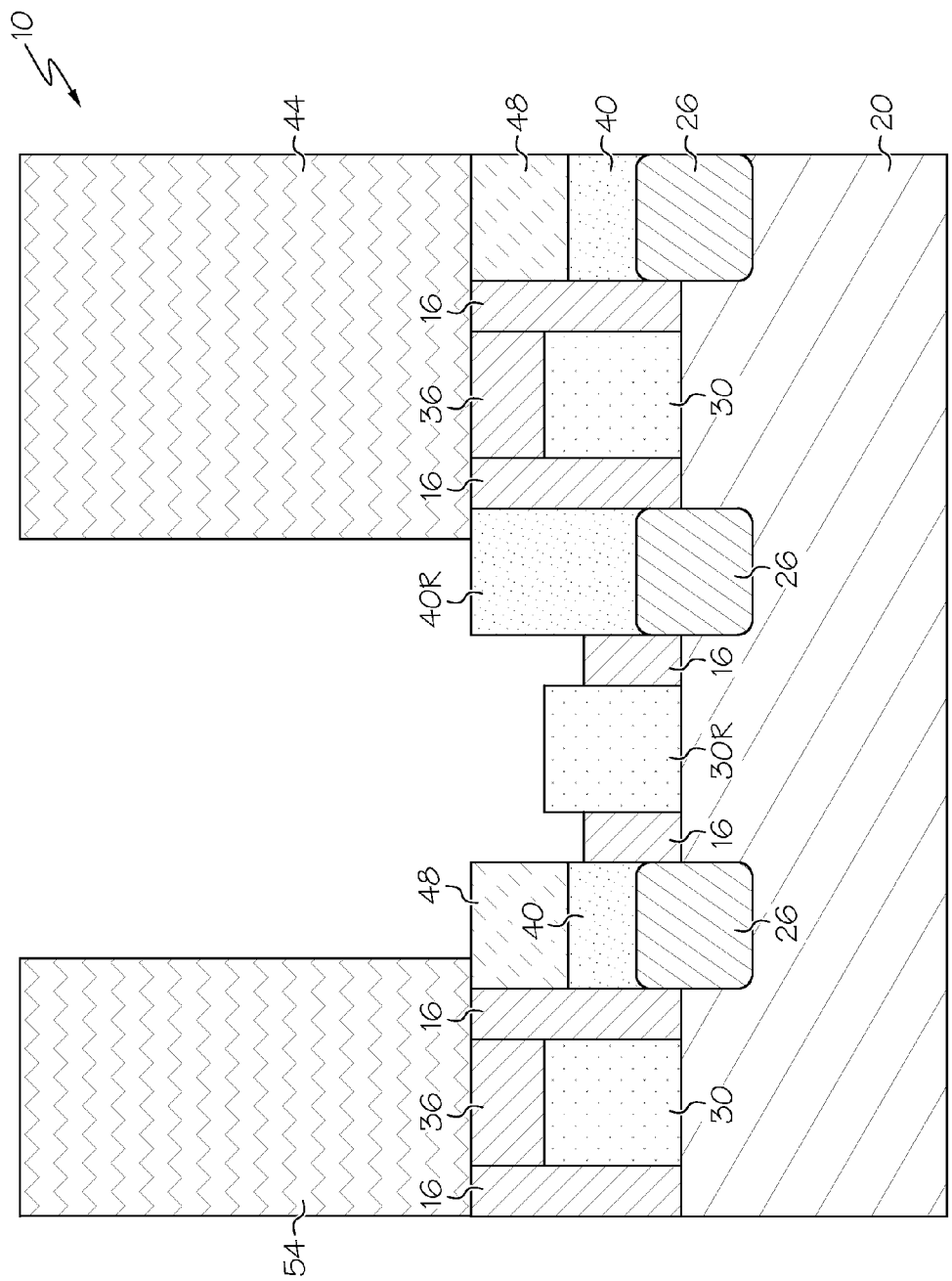
Figure 13:
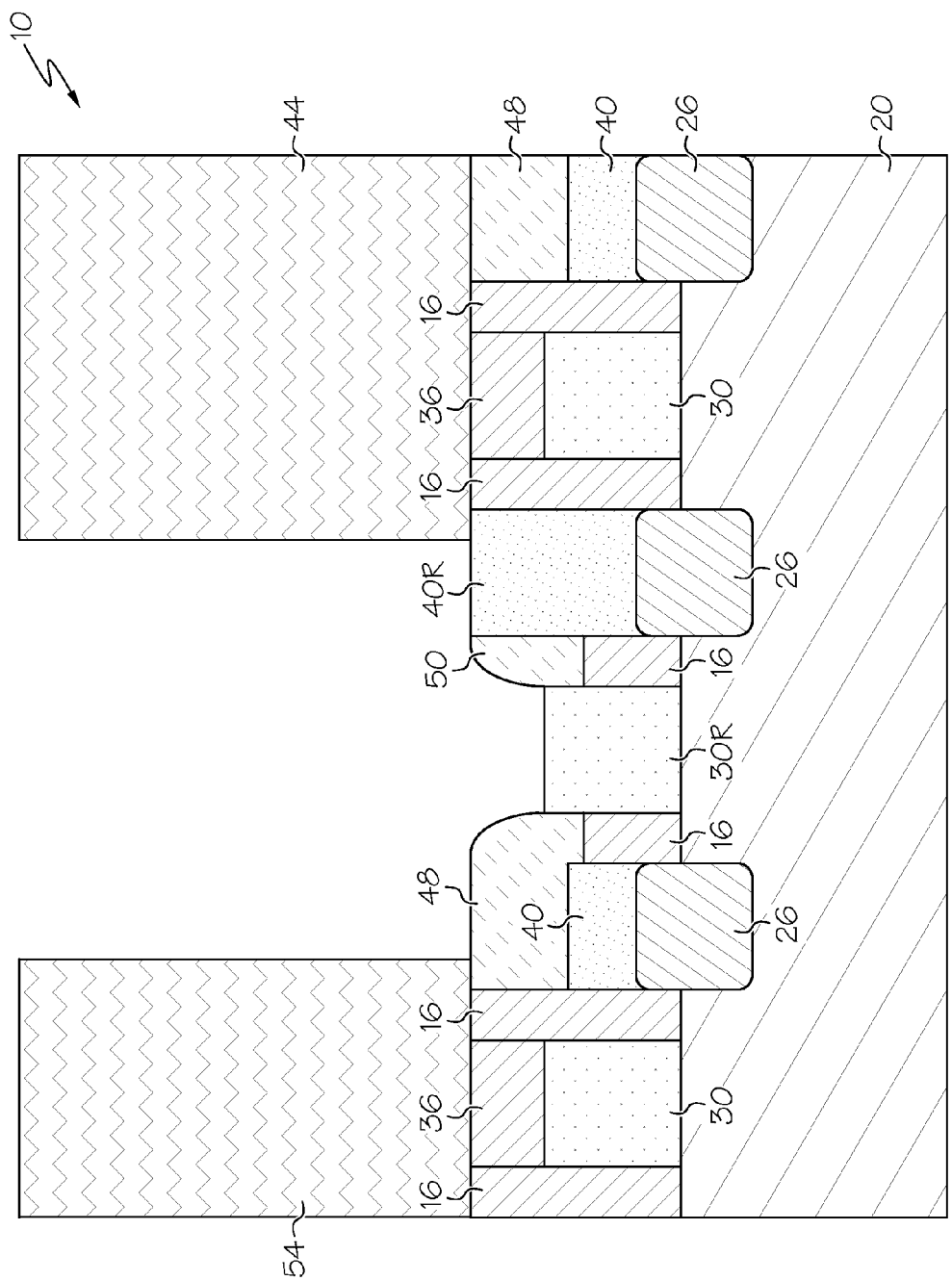

Often, similar elements may be referred to by similar numbers in various figures (FIGS.) of the drawing, in which case typically the last two significant digits may be the same, the most significant digit being the number of the drawing figure (FIG.). Furthermore, for clarity, some reference numbers may be omitted in certain drawings, in which:

FIG. 1 shows a semiconductor device according to an embodiment of the present invention;

FIG. 2 shows an etching of a contact trench according to an embodiment of the present invention;

FIG. 3 shows a recessing of a gate structure and a forming of a gate capping layer in the device of FIG. 2 according to an embodiment of the present invention;

FIG. 4 shows a forming of an s/d contact in the device of FIG. 3 according to an embodiment of the present invention;

FIGS. 5A-B show a placement of a first block mask on the device of FIG. 4 according to an embodiment of the present invention;

FIGS. 6A-C show a recessing of an s/d contact and a forming of an s/d contact cap in the device of FIGS. 5A-B according to an embodiment of the present invention;

FIGS. 7A-B show a placement of a second block mask on the device of FIGS. 6A-C according to an embodiment of the present invention;

FIG. 8 shows a removing of a gate capping layer on the device of FIGS. 7A-B according to an embodiment of the present invention;

FIG. 9 shows a forming of a liner layer on the device of FIG. 8 according to an embodiment of the present invention;

FIG. 10 shows a forming of a metal contact layer on the device of FIG. 9 according to an embodiment of the present invention;

FIGS. 11A-B show a placement of a first block mask and a second block mask on the device of FIGS. 6A-C according to an embodiment of the present invention;

FIG. 12 shows a removing of a gate capping layer on the device of FIGS. 11A-B according to an embodiment of the present invention; and FIG. 13 shows a forming of a liner layer on the device of FIG. 12 according to an embodiment of the present invention.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

As used herein, "depositing" may include any now known or later developed techniques appropriate for the material to be deposited including, but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As indicated above, embodiments of the present invention provide an improved semiconductor structure and methods of fabrication that provide improved transistor contacts in a semiconductor structure. A first block mask is formed over a portion of the semiconductor structure. This first block mask covers at least a portion of at least one source/drain (s/d) contact location. An s/d capping layer is formed over the s/d contact locations that are not covered by the first block mask. This s/d capping layer is comprised of a first capping substance. Then, a second block mask is formed over the semiconductor structure. This second block mask exposes at least one gate location. A previously formed gate capping layer, which comprises a second capping substance, is removed from the exposed gate location(s), typically with an anisotropic dry etch. Then a metal contact layer is deposited. This metal contact layer forms a contact to both the s/d contact location(s) previously covered by the first block mask and to the gate contact location(s) exposed by the second block mask.

Referring now to FIG. 1, a cross-sectional view of a semiconductor device 10 according to an embodiment of the present invention is shown. As depicted, device 10 may include a set of gate stacks 12A-B formed over a substrate 20. Gate stacks 12A-B may include dummy gates 14A-B (e.g., polysilicon, SiOC, SiOCN, and/or the like), spacers 16, a gate dielectric 18, and/or a liner layer (not shown).

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type of semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

As further shown, device 10 may include NFET region 22, PFET region 24, isolation region 23, raised source-drains (RSDs) 26A-D, which can include one or more phosphorus silicon (SiP) regions, one or more silicon germanium (SiGe) regions, and/or the like. It is understood that the specifying of portions of RSD 26A-D in accordance with use of certain materials (e.g., SiP and SiGe) should not be seen as limiting, but, rather, use of any materials now known or later developed as being adapted for use in RSDs 26A-D is envisioned. As further shown in FIG. 1, an inter-layer dielectric (ILD) 28 can also be deposited over semiconductor device 10 (e.g., over gate stacks 12A, 12B, RSDs 26A-D, etc.) and polished (e.g., via chemical-mechanical polishing (CMP)). It is understood that these layers/components are intended to be illustrative only and that other layers and/or materials may exist in device 10.

Referring now to FIG. 2, an alternative view of semiconductor structure 10 according to an embodiment of the invention is shown. As illustrated, dummy gates 14A-B (FIG. 1) have been removed from semiconductor device 10, and a set of gates 30 have be formed in forming gate region/areas in place of dummy gates (14A-B). These gates can be replacement metal gates and can be formed by depositing a series of gate material layers, which can include an oxide stack, including, but not limited to, Hafnium Oxide, covered by one or more work-function and/or field metal layers, which can include, but not be limited to: Ti, TiN, Ta, TaN, TiAl, Al, Cu, Co, TiC, W, and/or the like. Additionally or in the alternative, any other solution now known or later discovered can be utilized (e.g., a metal gate of a single uniform substance).

Further, a set of contact trenches have be formed to RSD 26A-D (FIG. 1). For example, one or more layers, including one or more of, but not limited to, an encapsulation layer, a patterning sacrificial layer, and/or a hardmask layer can be formed over semiconductor device 10, using any solution. Then contact trench can be etched using the hardmask layer (e.g., using a photoresist) as a guide. This contact trench can be formed in a single uninterrupted process or series of processes that etch through the patterning sacrificial layer, if present, through the encapsulation layer, if present, through ILD 28, and through spacer 16, if present, to silicon forming RSD 26. Then, the hardmask layer can be removed using a chemical hardmask strip or using any process now known or later developed. Contact trench can be formed as a byproduct of the processing of the dummy gates 12. A fill 34 is then deposited into contact trench 32 and semiconductor device 10 is planarized, such as using a CMP or the like. Fill 34, in an embodiment, includes an oxide, such as a flowable oxide or the like.

Referring now to FIG. 3, a forming of a gate capping layer 36 in the semiconductor device 10 of FIG. 2 is shown according to an embodiment of the present invention. First, gates 30 are recessed. This recessing can be performed using a metal etch. Such a metal etch removes metal, such as that forming gate 30, without impacting nitrides, such as those that can be used to form spacers 16, or oxides, such as those that can be used to form fill 34. In any case, once gates 30 have been recessed, a capping substance can be deposited over semiconductor device 10 and planarized to form gate capping layers 36 over each of the recessed gates. In an embodiment, gate capping layers 36 have a composition (such as a nitride) that is different from that of fill 34, but similar to that of spacers 16.

The inventors of the current invention have discovered that the prior art processes for forming and connecting contacts in a semiconductor device 10 suffer deficiencies as the form factor of the semiconductor device 10 decreases. Currently, these processes are done via a process called multiple-patterning. In this process, a series of lithographic overlay patterns are placed over the semiconductor device 10, after which an etch is performed with respect to each lithographic pattern. However, as the electrically equivalent gate length of the semiconductor device 10 falls below 10 nm, more successive patterns are needed to form the structures, with triple-patterning or above being required. However, each lithography pattern that is used increases the time and cost to form the semiconductor device 10. Further, multiple lithography patterns must be correctly aligned for the device to perform correctly. This alignment becomes increasingly difficult as the electrically equivalent gate length decreases and/or the lithography patterns become more complex, with adjacent tiny features requiring different color masks with stringent overlay requirements.

Referring now to FIG. 4, a forming of an s/d contact region 40 in the semiconductor device 10 of FIG. 3 according to an embodiment of the present invention is shown. As illustrated, fill 34 is removed. This removing can be performed using an etch (e.g., an oxide reactive ion etch) that etches the material forming fill 34 (e.g., oxide), such that the material forming fill 34 is removed without impacting the material (e.g., nitrides) forming gate capping layers 36 and/or spacers 16. This removing can be performed through a mask, for instance one similar to the type used for the active patterning so that contacts get landed on active silicon only and not on isolation 23. Then, a contact metal can be used to form contact region 40. This contact metal could include tungsten, copper, cobalt, and/or any other metal now known or later developed for forming s/d contacts and/or can be used in conjunction with a liner (e.g., TiN). In any case, as the original lithography used to form contact trench 32 (FIG. 2) is performed on a large scale, the process of removing fill 34 to form contact region 40 yields a larger area contact region 40 that is borderless and self-aligning and which can be used to create the final contacts as will be shown.

Large scale lithography can be thought of as a lithography that typically does not require the most advanced process (i.e., not immersion 193 nm and therefore cheaper) and can be characterized by the fact that larger islands and spaces are created. Borderless TS fabrication is a good example of large scale lithography. The litho features are large islands (similar to RX active mask), but the ultimate patterned features on the silicon structure (e.g., the contact trenches themselves) can be much finer, as the process involves material selectivity at etch within the openings defined by lithography—in this instance, oxide etch selectivity to the nitride-encapsulated gates.

Referring now to FIGS. 5A-B, a placement of a CZ1 block mask 44 on semiconductor device 10 of FIG. 4 according to an embodiment of the present invention is shown. As illustrated, FIG. 5A shows a cross-section view while FIG. 5B shows a top-down view with a region 42 corresponding to that of FIG. 5A. CZ1 block mask 44 is placed in such a way that it covers at least a portion of one or more s/d contact location(s) 40N, while leaving other s/d contact location(s) 40 uncovered.

Referring now to FIGS. 6A-C, a forming of an s/d capping layer 48 in the semiconductor device 10 of FIG. 5A is shown according to an embodiment of the present invention. First, s/d contact regions 40 are recessed. This recessing can be performed using a metal etch. Such a metal etch removes metal, such as that forming s/d contact regions 40 without impacting nitrides, such as those that can be used to form spacers 16. However, since a portion of s/d contact region(s) 40N is covered by CZ1 block mask 44, this region is unaffected by the recessing operation. CZ1 block mask can then be stripped, or at least the organic portion of it (i.e., photoresist). Subsequently, once s/d contact region(s) 40 have been recessed, a capping substance (e.g., oxide) can be deposited over semiconductor device 10 and planarized to form s/d capping layer 48 over each recessed s/d contact location(s) 40 that has not been covered by CZ1 block mask. Conversely, region 46 of s/d contact location(s) remains unrecessed and uncapped, as can be seen from the views of FIGS. 6A-C. In an embodiment, s/d capping layer 48 has a composition (e.g., oxide) that is different from that of gate capping layers 36, allowing for etch selectivity as will be shown.

Referring now to FIG. 7A-B, a placement of a CZ2 block mask 54 on semiconductor device 10 of FIG. 6A-B according to an embodiment of the present invention is shown. As illustrated, FIG. 7A shows a cross-section view while FIG. 7B shows a top-down view with region 42 corresponding to that of FIG. 7A. As illustrated, CZ1 block mask 44 is shown for reference; however, in an embodiment, CZ1 block mask 44 can be removed prior to placement of CZ2 block mask 54. In any case, CZ2 block mask 54 is placed in such a way that it exposes at least a portion of one or more gate(s) 30N as capped with gate capping layer(s) 36, while leaving other gate(s) 30 covered.

Referring now to FIG. 8, a removing of gate capping layer(s) 36 from semiconductor device 10 of FIG. 7A-B according to an embodiment of the present invention is shown. This removal can be performed using an etch (e.g., a nitride reactive ion etch) that etches the material forming gate capping layer(s) 36 (e.g., nitride), such that the material forming gate capping layer(s) 36 is removed without impacting the material (e.g., oxide) forming s/d capping layers 48. However, since a portion of gate(s) 30 is covered by CZ1 block mask 44 and/or CZ2 block mask 54, these regions are unaffected by the removal operation. This exposes only gate(s) 30N that were uncovered by CZ1 block mask 44 and/or CZ2 block mask 54, while gate capping layer(s) 36 remain over all gates 30 covered by CZ1 block mask 44 and/or CZ2 block mask 54.

Referring now to FIG. 9, a forming of a liner layer 50 on the device of FIG. 8 according to an embodiment of the present invention is shown. As shown, removing of gate capping layer(s) 36 can also remove a portion of spacer 16. Accordingly, liner layer 50 can be formed adjacent to the gate(s) 30N from which gate capping layer(s) 36 was removed. To this end, liner layer 50 can be formed using any solution now known or later developed for forming a dielectric liner barrier. In an embodiment, a combination of a deposition followed by an anisotropic etch, to form a spacer, is utilized. In an embodiment, liner layer 50 comprises an oxide deposited with Atomic-Layer Deposition (ALD) or Molecular-Layer Deposition (MLD) techniques. In any case, as also shown, whichever of CZ1 block mask 44 and/or CZ2 block mask 54 remains is removed.

Referring now to FIG. 10, a forming of a metal contact layer on the device of FIG. 9 according to an embodiment of the present invention is shown. As discussed, the smaller components (e.g., CZ_E1 46 and CZ_E2 56) have already been formed. As such, the remainder of the contact can be formed by the depositing of contact layer 52 that does not require small scale lithography. To this extent, larger scale lithography can be used to deposit contact layer 52 or, alternatively, contact layer 52 that forms a contact for multiple components can be deposited in a single step. Then, as illustrated, large scale lithography can be used to form one or more isolation barriers 55 as needed. For example, once metal contact layer 52 has been formed, large scale lithography can be used to etch one or more trenches in metal contact layer 52. A material (e.g., an oxide) can then be deposited in these trenches and planarized to form the final isolated contacts.

Referring now to FIG. 11A-B, an alternate placement of CZ1 block mask 44 and CZ2 block mask 54 is shown. As illustrated, CZ1 block mask 44 and CZ2 block mask 54 can also be adjacent or overlapping. In this case, rather than forming contacts to gate 30N and s/d region 40N, which are remote from each other, as shown in FIG. 8, the placement of CZ1 block mask 44 and CZ2 block mask 54 shown in FIGS. 11A-B results in gate capping layer(s) 36 being removed from over gate(s) 30R that is adjacent to the uncapped contact region(s) 40R, as shown in FIG. 12. Then, liner layer 50 can be formed adjacent to the gate(s) 30N from which gate capping layer(s) 36 was removed as shown in FIG. 13. Subsequent metal layer 52 deposition could result in a so-called stitching of adjacent gate 30R and contact 40R, meaning they would be electrically tied.

As can now be appreciated, embodiments of the present invention provide an improved semiconductor structure and methods of fabrication that provide transistor contacts that are self-aligned in two dimensions. This serves to improve middle-of-line (MOL) density, which is often a limiting factor with scalability.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a set of contacts in a semiconductor structure comprising:
    forming a first block mask over a portion of the semiconductor structure, wherein the first block mask covers at least a portion of at least one source/drain (s/d) contact location;
    forming a s/d capping layer over a set of s/d contact locations that are not covered by the first block mask, the s/d capping layer comprising a first capping substance;
    forming a second block mask over the semiconductor structure, wherein the second block mask exposes at least one gate location;
    removing a gate capping layer from the at least one gate location, the gate capping layer comprising a second capping substance; and
    depositing a metal contact layer that forms a contact to the at least one s/d contact location and to the at least one gate location.

2. The method of claim 1, further comprising depositing, subsequent to the removing of the gate capping layer, a spacer layer proximate to the at least one gate contact location.

3. The method of claim 1, wherein the forming of the s/d capping layer further comprises depositing silicon oxide to cover the set of s/d contact locations that are not covered by the first block mask with the first capping substance.

4. The method of claim 1,
    wherein the second capping substance comprises silicon nitride, and
    wherein the removing of the gate capping layer from the at least one gate contact location further comprises performing an etch that removes silicon nitride without removing any of: the first capping substance, a gate metal forming the gate location, or an s/d contact metal forming the at least one s/d contact location.

5. The method of claim 1, wherein the gate location is a replacement metal gate.

6. The method of claim 1, further comprising:
    etching a gate metal that forms a plurality of gate locations, which includes the at least one gate location, to recess the gate location; and depositing the second capping substance over the plurality of gate locations to form the gate capping layer over each of the plurality of gate locations.

7. The method of claim 1, wherein a placement of the second block mask is at least one of: adjacent to the second block mask, or overlapping the first block mask.

8. A method of forming a semiconductor device comprising:
  forming a set of source-drain (s/d) regions and a set of replacement metal gates on a substrate;
  etching a set of contact trenches to the set of source-drain regions;
  depositing an s/d contact metal in the set of trenches to form a set of s/d contact locations;
  forming a first block mask over a portion of the semiconductor device, wherein the first block mask covers at least a portion of at least one s/d contact location of the set of s/d contact locations;
  forming an s/d capping layer over a set of s/d contact locations that are not covered by the first block mask, the s/d capping layer comprising a first capping substance;
  forming a second block mask over the semiconductor structure, wherein the second block mask exposes at least one gate location;
  removing a gate capping layer from the at least one gate location, the gate capping layer comprising a second capping substance; and
  depositing a metal contact layer that forms a contact to the at least one s/d contact location and to the at least one gate location.

9. The method of claim 8, further comprising depositing, subsequent to the removing of the gate capping layer, a spacer layer proximate to the at least one gate contact location.

10. The method of claim 8, wherein the forming of the s/d capping layer further comprises covering the set of s/d contact locations that are not covered by the first block mask with the first capping substance, which comprises depositing silicon oxide.

11. The method of claim 8,
  wherein the second capping substance comprises silicon nitride, and
  wherein the removing of the gate capping layer from the at least one gate contact location further comprises performing an etch that removes silicon nitride without removing any of: the first capping substance, a gate metal forming the gate location, or the s/d contact metal forming the s/d contact location.

12. The method of claim 8, further comprising:
  masking an isolation region on the semiconductor structure;
  removing an oxide fill from a contact trench selective to a material encapsulating the gates; and
  depositing the s/d contact metal in the contact trench to form the s/d contact location.

13. The method of claim 8, further comprising:
  etching a gate metal that forms a plurality of gate locations, which includes the at least one gate location, to recess the gate location; and
  depositing the second capping substance over the plurality of gate locations to form the gate capping layer over each of the plurality of gate locations.

* * * * *